United States Patent [19]

Brossman, Jr. et al.

[11] 4,436,474
[45] Mar. 13, 1984

[54] SELECTING ARTICLES FROM AN ARRAY THEREOF

[75] Inventors: James W. Brossman, Jr., Bethel; Carol A. Nemeth, Reading; Alan K. Shapiro, Shillington, all of Pa.

[73] Assignee: Western Electric Co., Inc., New York, N.Y.

[21] Appl. No.: 337,051

[22] Filed: Jan. 4, 1982

[51] Int. Cl.³ .............................................. B65B 19/34
[52] U.S. Cl. .................................... 414/417; 206/334; 74/567; 414/786
[58] Field of Search .................. 414/416, 417, 786; 221/87, 89; 206/454, 334; 312/125, 135, 186, 305; 74/567

[56] References Cited

U.S. PATENT DOCUMENTS

| 2,594,633 | 4/1952 | Freimann et al. | 369/188 |
| 2,610,858 | 9/1952 | Kenney | 369/192 |
| 3,476,265 | 11/1969 | Powers | 414/417 X |
| 3,923,156 | 12/1975 | Wallestad | 206/454 |
| 3,926,323 | 12/1975 | Frank et al. | 414/417 |
| 4,311,427 | 1/1982 | Coad et al. | 414/417 X |

OTHER PUBLICATIONS

Drexinger et al., Western Electric Technical Digest, "Transfer of Semiconductor Wafers Between Holders", Jan. 1979, pp. 3 and 4.

W. E. Spangler et al., Bell Telephone Laboratories, Inc., Photographs of Water Selecting Tool.

Primary Examiner—Robert J. Spar
Assistant Examiner—Ken Muncy
Attorney, Agent, or Firm—D. C. Watson

[57] ABSTRACT

An assembly is provided for selecting at least one vertically oriented planate article such as a disc-shaped wafer (10) from an array of such wafers. A carrier (20) holds the wafers (10) in a mutually spaced, substantially parallel relationship along a single horizontal file. Peripheral portions of each wafer (10) are supported in opposing guides (26) formed generally vertically along opposing first and second sidewalls (22) and (24), respectively, of the carrier (20). A frame (42) positions the carrier (20) so the file of wafers (10) extends substantially along a vertical plane (44) passing generally centrally of each wafer and of the frame (32). A rotatable shaft (62) extends parallel to the file and subjacent of the wafers (10). For selecting a singular wafer (10), at least one cam (64) is mounted to and rotates with the shaft (62) for engaging and displacing a randomly selected wafer (10) a desired distance upwardly along the guides (26) of the carrier (20). For selecting groups of wafers (10), for example every third wafer (10) in the file, a plurality of cams (64) are mounted to shaft (62). Then one such cam (64) is located in a plane passing through every third wafer (10) starting with a desired wafer, such as the lead wafer in the file. The rotatable shaft (62) is also indexable so that a single cam (64) or a plurality of such cams may be serially or randomly located along the file in cycles to optionally provide access to all wafers (10) in the file.

13 Claims, 7 Drawing Figures

SELECTING ARTICLES FROM AN ARRAY THEREOF

TECHNICAL FIELD

This invention relates to selecting articles from an array thereof and, more particularly, to at least partially displacing at least one disc-shaped wafer from a single file array in a carrier.

BACKGROUND OF THE INVENTION

Thin, planate articles such as wafers and discs are economically handled by merely disposing one article horizontally upon another in a vertical column. However, if the articles are fragile, if the surfaces are vulnerable to scratches or if ready access to individual articles is desired, then different expedients are indicated. Such expedients may include a vertical or horizontal column of articles held in a succession of individual pockets, often referred to as a "file." Normally, if such a file of articles is to be carried about, the articles are each vertically oriented in a mutually spaced, parallel relationship along a single, horizontal file in a carrier.

Such carriers are particularly evident in the semiconductor industry where disc-shaped wafers, typically of monocrystalline silicon, form a basic medium for making electronic devices. Such wafers may be about 100 mm in diameter by about 0.5 mm in thickness and weigh about 15-20 grams. Prior to forming devices therein, the wafers are ground and polished and often edge contoured to minimize chipping. Thereafter, several hundred discrete steps may be taken to form about 200 circuits in such a wafer and each circuit may include 60,000 or more microelectronic devices. It will be appreciated that such wafers take on considerable value as they are processed; yet they are fragile, their features are delicate and they are readily damaged. Consequently, great care is required to avoid chipping the edges or scratching and abrading, particularly on active surfaces containing the microminiature devices.

One popular carrier for handling such wafers is about 140 mm long by about 125 mm wide by about 115 mm high and accommodates 25 wafers, each in a separate pocket. The carrier has a fully accessible top, partially open bottom and ends and slotted sidewalls. Accordingly, there is considerable access to the wafers for process solution and drainage or for loading and unloading wafers. The sidewalls have lower portions which are offset inwardly to support along the curve of a wafer, engaging only edge portions thereof. The sidewalls also have opposing guides, forming therebetween mutually spaced, substantially parallel pockets for retaining wafers in a separated manner.

Such a carrier is suitable for most process steps so the wafers need not be repetitively transferred to and from other holders. However, for very hot operations such as solid state diffusion, the wafers are transferred to different holders and such transfer is fraught with difficulty. Also, the wafers are spaced so close in the described carrier that it is difficult to remove a randomly selected wafer for inspection or testing without damage to it or to adjacent wafters.

One way to transfer the wafers is to equip a receiving holder with pockets corresponding to those of the carrier. Then the holder may be mated to the carrier and both inverted whereby the wafers slide from carrier to holder. Another batch method is to carefully stand a filled carrier on end and push the wafers from carrier to holder pockets. Another common method of transfer is to utilize a pair of tweezers especially made to grasp narrow, marginal surfaces of a wafer. These and other techniques invite a risk of frequent damage due to sudden stops, frictional debris and grasping stresses which cause edge chipping and surface abrasion.

An improved technique for selecting wafers from a close array includes a mechanism for displacing at least one wafer at a time upwardly in a pocket. Then a vacuum tool is advantageously applied to a minimally sensitive, inactive surface and a wafer is manipulated thereby with little risk of damage to it or to adjacent wafers. Such selection mechanisms generally function by a series of levers and return springs and are awkward in operation. Moreover, the mechanisms are complicated and costly to provide.

Consequently, it is desirable to provide new and improved expedients for selecting thin, planate articles from an array thereof. It is preferred to select disc-shaped wafers by displacing selected random ones at least partially out of pockets in a carrier. Alternatively, it is preferred to displace select groups, for example every third wafer, from normal rest positions along a single file in a carrier.

SUMMARY OF THE INVENTION

Apparatus for selecting at least one vertically oriented, planate article from an array thereof includes a carrier for holding such articles in a mutually spaced, substantially parallel relationship along a single, horizontal file. Peripheral portions of each article are supported in opposing guides formed generally vertically along opposing first and second sides of the carrier. There is a frame for positioning the carrier so the file of articles extends substantially along a vertical positioning plane passing generally centrally of each article and the frame. A rotatable shaft extends parallel to the file and subjacent of the articles. At least one cam is mounted to and is rotatable with the shaft for engaging and at least partially displacing an article a desired distance along the guides of the carrier.

In a method embodiment of the invention, the above-described apparatus may be utilized to hold the articles and to position the carrier. The rotatable shaft is extended parallel to the file and subjacent of the articles and includes at least one cam mounted thereto for engaging the articles. An article is engaged and at least partially displaced a desired distance along the guides of the carrier by rotating the shaft and the cam.

BRIEF DESCRIPTION OF THE DRAWING

The invention will be more readily understood from the following detailed description thereof when read in conjunction with the accompanying drawing, wherein.

DETAILED DESCRIPTION

The Articles

Figure 2:
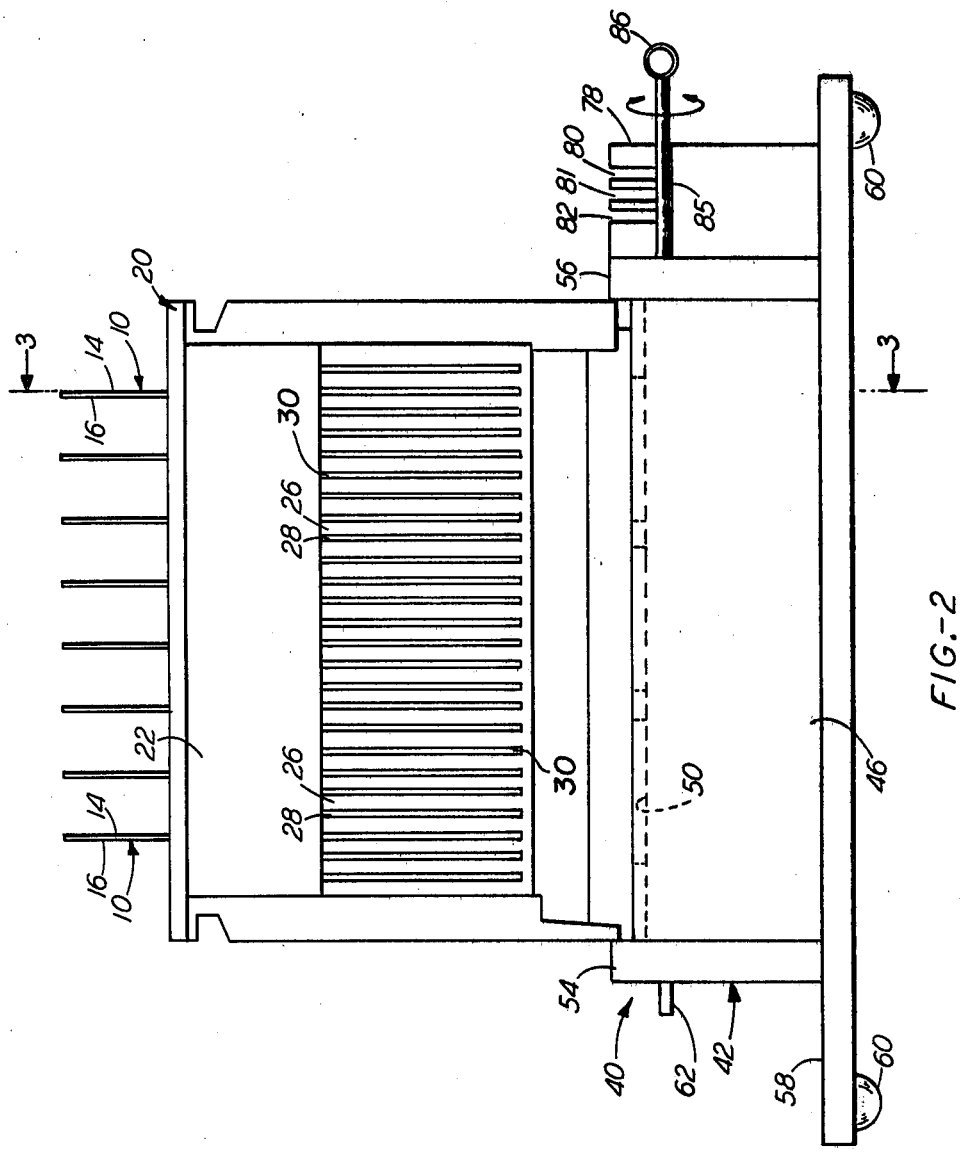
FIG. 2 is an elevation view of the apparatus of FIG. 1 on which is positioned a carrier of articles under selection in accordance with the instant invention.
Figure 3:
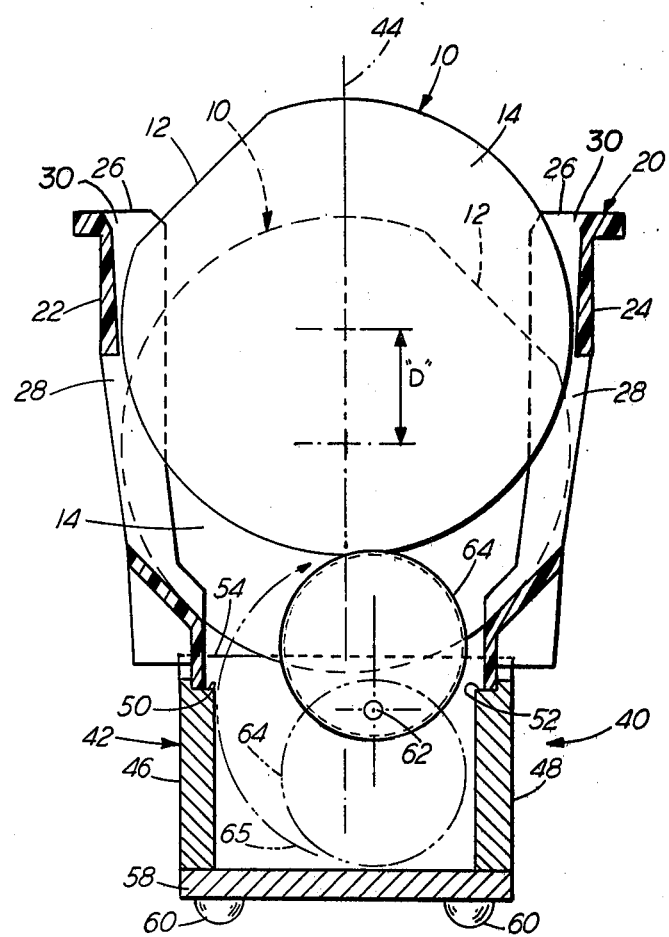
FIG. 3 is a sectional view of the apparatus and carrier shown in FIG. 2, taken along line 3—3.

In FIGS. 2 and 3 there appears at least one planate article 10 which is selected from an array thereof in the practice of the invention. The term "planate" is utilized because the articles are formed in a flattened condition, i.e., as relatively thin articles having two major, somewhat parallel surfaces and peripheral edge portions. For purposes of illustration and discussion, the articles 10 will often be referred to hereinafter as disc-shaped wafers 10 formed of monocrystalline silicon. Nevertheless, it will be appreciated that other planate articles and indeed other semiconductor wafers can as well be selected from an array in the practice of the invention.

The wafers 10 form a basic medium from which a multitude of discrete electronic devices or integrated circuits may be made. Such wafers are known to vary in size, for example, from less than 25 mm to greater than 125 mm in diameter and from less than 0.4 mm to greater than 0.6 mm in thickness. For an illustrative example, a wafer 10 will be assumed to be about 100 mm in diameter by about 0.5 mm thick and weigh about 15–18 grams. Such wafers 10 are typically cut from an essentially right cylindrical crystal in a direction normal to its longitudinal axis. To aid in subsequent manufacturing operations, a flat surface is commonly ground along a longitudinal path on the surface of the crystal prior to slicing. Consequently, such a slice, called a wafer in the industry, may have a chordal discontinuity in its generally circular periphery and such discontinuity is referred to herein as a flat 12. Flat 12, and sometimes another minor chordal discontinuity (not shown), are often used to orient a wafer 10 for photolithographic masking and for other purposes.

Like other planate articles, a wafer 10 has two major surfaces and peripheral edges; however, such edges are continuous in a generally circular arc and the shape of the wafer 10 is considerably more improved. For example, after being sliced, a wafer 10 is ground substantially flat on major, active and inactive surfaces 14 and 16, respectively, and such surfaces are made substantially parallel to one another. Active surface 14 is further polished to a highly reflective and scratch-free condition and as close to a perfect plane as practical technology will allow. Quite often the peripheral edge portions of wafer 10 are further ground to a rounded condition to make wafer 10 less sensitive to crack propagation from notches caused by edge chipping.

After polishing, wafer 10 may be subjected to as many as 500 discrete processing steps to form circuits and microelectronic devices on its active surface 14. Consequently, each wafer 10 takes on considerable value, for example hundreds of dollars each, so that great care is indicated to avoid injury thereto.

Thin, planate articles are typically more vulnerable to cracking than thick, bulky articles and wafers 10 of silicon are no exception. Also, the delicate features formed in and along the active surface 14 are particularly vulnerable to scratches from sharp edges and abrading by fine debris. Consequently, it is desirable to handle wafers 10 with a minimum of surface contact, especially upon the active surfaces 14.

The Carriers

The disc-shaped wafers 10 are typically supported on edge with the major surfaces 14 and 16 oriented vertically to facilitate viewing and access by solutions and drainage in processing. To preserve space in process baths, it is desirable to hold a plurality of such wafers 10 in a closely spaced array. Ideally, the wafers 10 should be held in a mutually spaced, substantially parallel relationship along a single, horizontal file. In that array, the polar axes of the wafers are closely coincident so the wafers could be said to be aligned along a common horizontal axis. Also, to minimize surface injury and to maximize solution access, the wafers 10 should be individually edge supported with as little contact as practicable.

A popular carrier for holding the wafers 10 as described above is shown in FIGS. 2 and 3 and designated generally by the numeral 20. Carrier 20 may preferably be made of a plastic such as polypropylene or, for very hot processes a perfluoroalkoxyl-substituted, polytetrafluoroethylene plastic, both of which are yielding to the wafers. Carrier 20 typically has a fully accessible top portion, partially open bottom and end portions and first and second sidewalls 22 and 24, respectively, both of which are preferably slotted.

On each sidewall 22 and 24 there are vertical guides 26, formed successively between and extending above and below slots 28. A pair of guides 26 on sidewall 22 and a pair of guides 26 on sidewall 24, advantageously form therebetween a pocket to receive an individual wafer 10. Openings between guides 26 on a sidewall tend to narrow as they deepen so the edge portions of a wafer 10 are guided into narrow seats where a minimum of contact is made to surfaces 14 and 16. Lower portions of the guides 26 and the seats therebetween are offset inwardly of the sidewalls to support along the curve of a wafer 10 and to bear for short distances on either side of the center of gravity of the wafer.

Carrier 20 may hold about twnety-five wafers 10 in individual pockets 30 and every fifth pocket may be numbered along each sidewall to facilitate aligning a wafer in its appropriate pocket. It can be seen in FIG. 3 that a wafer 10 may be readily displaced upwardly in its respective pocket but otherwise it is secure with excellent access for solutions to and drainage from the wafers 10. A suitable commercially available carrier of the type described above for 100 mm wafers is sold by Fluoroware Co. of Chaska, Minn. as its model A72-40.

Article Engaging and Displacing

Figure 1:
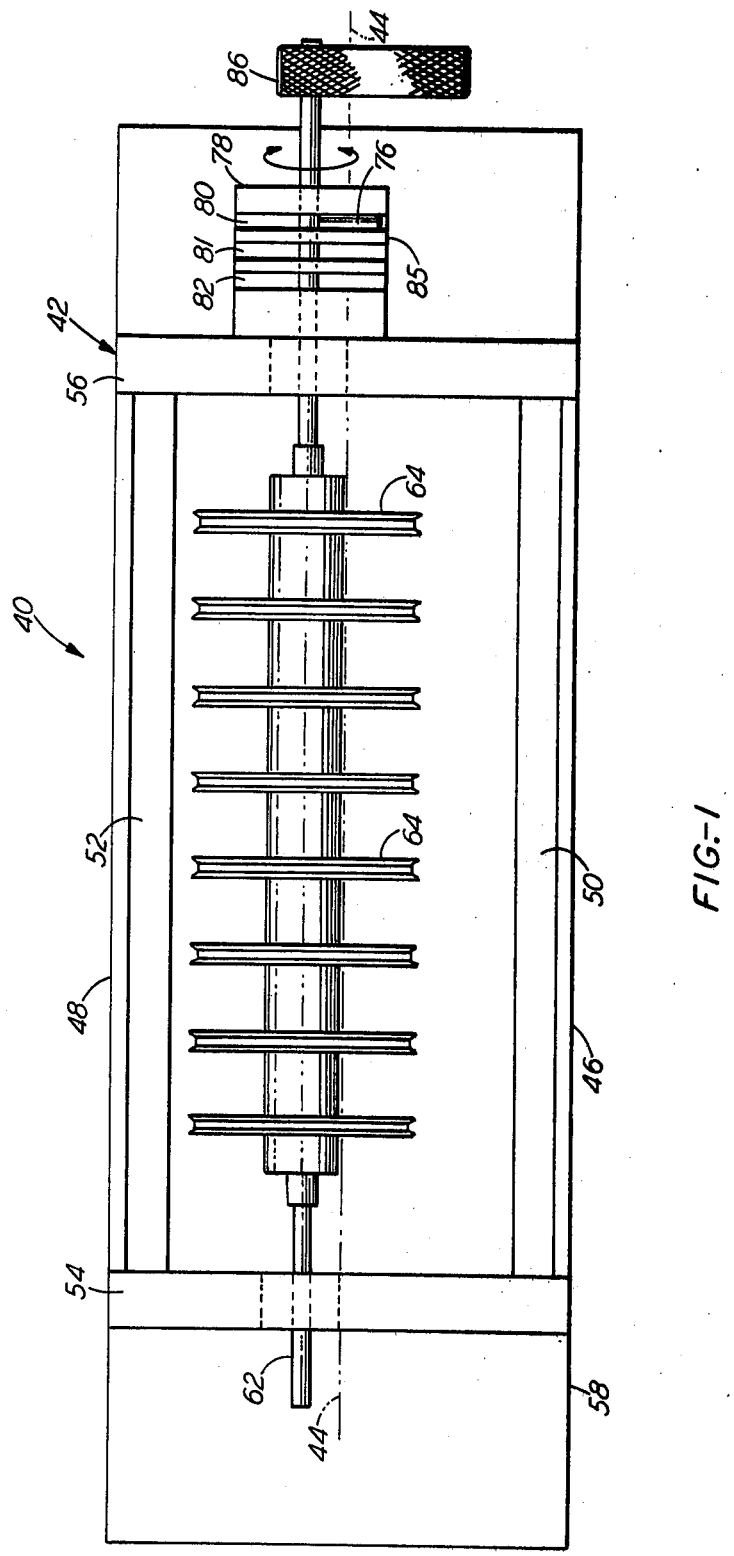
FIG. 1 is a plan view of apparatus for selecting articles in accordance with the instant invention.

FIG. 1 is a plan view of apparatus designated generally by the numeral 40 for engaging and displacing articles such as wafers 10 from an array such as that seen in carrier 20. The combination of a carrier 20 containing wafers 10 and apparatus 40 is seen in FIGS. 2 and 3 so the following discussion will be directed to FIGS. 1–3.

Apparatus 40 includes a frame designated generally by the numeral 42 for positioning carrier 20 so the file of wafers 10 extends substantially along a vertical positioning plane 44 (FIGS. 1 and 3). Plane 44 is a theoretical plane which passes generally centrally of each wafer 10 and the frame 42.

Frame 42 includes first and second sideplates 46 and 48, respectively, having inset portions 50 and 52 to support a carrier 20 in the manner seen in FIGS. 2 and 3. Frame 42 further includes endplates 54 and 56 which help to locate and confine a carrier 20 in a direction longitudinal of the file as seen in FIG. 2. The frame 42 and other features of apparatus 40 are mounted to a plate 58 which may be supported from a work surface by corner bumpers 60 seen in FIGS. 2 and 3.

FIGS. 1–3 show a rotatable shaft 62 extending parallel to the file and subjacent of the wafers 10. Mounted to shaft 62 are expedients for engaging and displacing at least one wafer 10 a desired distance along the guides 26 of carrier 20. In the illustrative example, such expedients include at least one cam 64 mounted eccentrically to shaft 62. Cam 64 may be responsive to the rotation of shaft 62 thereby moving eccentric portions of such cam arcuately toward and engaging edge portions of a wafer 10 to displace it in an upwardly direction. FIG. 3 clearly illustrates a condition after shaft 62 and cam 64 have been rotated 180 degrees and a wafer 10 has been displaced about 25 mm upwardly along guide 26. Such displacement is indicated by dimension "D" extending from the axis of an undisplaced wafer 10 shown in the background to the axis of a displaced wafer 10 shown in the foreground. The idle position of cam 64 is incidentally seen in phantom lines in FIG. 3 and in solid lines in FIG. 1. Also, an arc 65 made by movement of the bottom edge of cam 64 is shown in phantom in FIG. 3.

It will be appreciated that a singular cam such as cam 64 could be indexed along the file by various methods to engage and displace randomly selected articles 10 therein. Cam 64 is preferably made of a resilient material which yields sufficiently upon contact to avoid damage to a wafer 10. A suitable material is sold by E. I. du Pont De Nemours Company under the trade designation "Teflon" polymer (a polytetrafluoroethylene plastic).

The wafer engaging surface extending about the periphery of a cam 64 includes a groove therein to more readily engage edge portions of a wafer 10. The groove is sufficiently wide to engage a wafer wherever it may rest within the openings formed between guides 26 holding a wafer 10. The engaging surface preferably extends about the periphery of a cam 64 in a circular arc, at least over the portion which contacts a wafer to be displaced. While a circular arc for cam 64 has been found suitable for wafers 10, it will be recognized that cams of other shapes may as well be used for wafers 10 or for other planate articles in the practice of the invention.

The shaft 62, as seen in FIG. 1, is designed to select more than one wafer 10 at a time as will be explained later. Moreover, shaft 62 is shown having an enlarged mid section for securing a plurality of cams according to known connections. However, in another embodiment (not shown), such a shaft is made substantially longer and of uniform section and supports a singular cam 64.

It is also evident that a shaft 62 and a cam 64 therewith need not be located eccentric of plane 44 as shown in FIGS. 1 and 3. As long as cam 64 has an eccentric portion which moves upward against a wafer 10 when shaft 62 is rotated, the wafer will be displaced even if shaft 62 extends coincident with plane 44. Nevertheless, it has been found preferable to locate shaft 62 eccentric of plane 44 for reasons which will now be explained.

FIGS. 4–7 are diagrams which are drawn to explain an advantageous cooperation between shaft 62, cam 64 and a wafer 10 to obtain a favorable result, namely, that the cam 64 engages closely about the center of gravity of a wafer 10.

Figure 4:
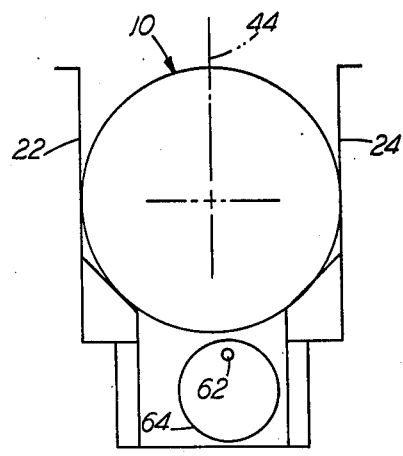
FIGS. 4-7 are diagrams to illustrate various stages of engaging and displacing articles according to the invention.

Referring to FIG. 4, the cam 64 can be seen at a rest position representative of all cams 64 in the condition shown in FIG. 1. Note that the eccentric portion of cam 64 hangs directly downward and that there is no cam engagement with wafer 10 which rests on offset portions of sidewalls 22 and 24, symmetrically about plane 44.

Figure 5:
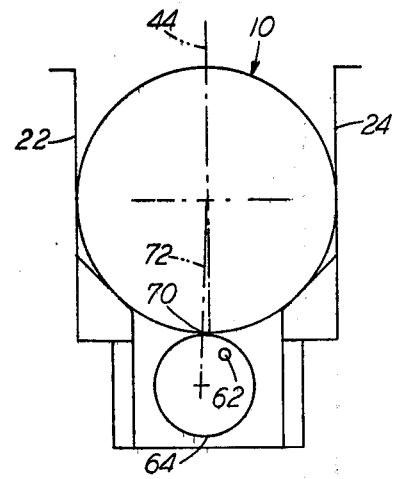

Referring next to FIG. 5, the cam 64 has now rotated clockwise sufficiently to make contact with wafer 10 at point 70 on the cam 64. A line 72 drawn between the axis of wafer 10 and the center of cam 64 passes through point 70 and indicates that contact is made just to the left of plane 44, i.e., just to the left of the center of gravity of wafer 10. Note that, as cam 64 continues its arcuate movement, wafer 10 will continually transmit a slight horizontal component of force working against sidewall 24 and virtually no force against sidewall 22.

Figure 6:
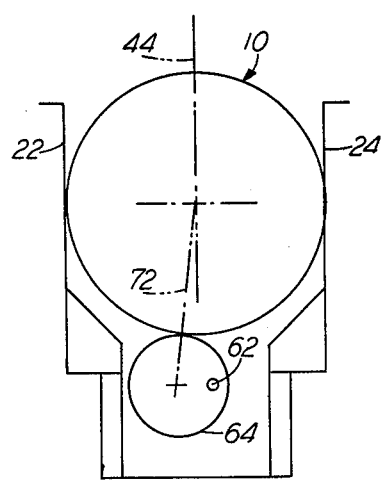

Referring next to FIG. 6, the cam 64 has now rotated 90 degrees from its initial position. The line 72 passing through the axis of wafer 10 and the center of cam 64 discloses that contact is made farther to the left of plane 44 than before. An angle measured between line 72 and plane 44 is somewhat larger than before and a component of force working against sidewall 24 has, therefore, increased slightly.

Figure 7:
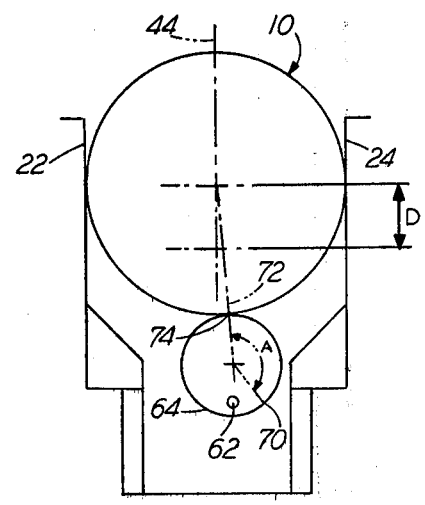

Referring finally to FIG. 7, the cam 64 has now been rotated 180 degrees from its initial position. The line 72 has reversed its arcuate movement, passing through plane 44 and now forms an almost identical angle with plane 44 as was shown in FIG. 7. The wafer 10 has been engaged very nearly symmetrically about plane 44 from FIG. 6 to FIG. 7 and closely about the center of gravity of wafer 10. A component of force now works against sidewall 22 which is nearly equal to the component working against sidewall 24 in FIG. 6. Consequently, wasteful horizontal components of force which generate friction have been kept to a favorable low level.

Several observations are usefully made from FIGS. 4–7. For example, wafer 10 may be initially located higher than shown in FIGS. 4 and 5 so contact with cam 64 is avoided until the cam has rotated 90 degrees as shown in FIG. 6. Consequently, there will then be improved symmetry of horizontal forces against the sidewalls from start to finish and contact about the center of gravity of wafer 10 will be improved. By reference to FIG. 7, it can be seen that an angle "A" has been indicated between the initial contact point 70 on cam 64 and a final contact point 74. Since angle A is less than 180°, it is evident that less than one-half of cam 64 is contacted in displacing a wafer 10. Consequently, a cam could be made less than one-half the size shown, provided that the given conditions obtain, for example that the contact surface extends in a circular arc as shown for cam 64.

Referring again to FIG. 1, it can be seen that shaft 62 extends through endpates 54 and 56 where lubricative bushings are provided. Therefore, shaft 62 and cams 64 attached thereto are advantageously indexed along a file of wafers for selective engagement thereto. A plurality of cams 64 are mounted to shaft 62, each being subjacent to and in a plane passing substantially through selected wafers in the file. In the illustrative example, eight cams 64 are so disposed that a cam passes through every third wafer in the file.

Near the right end of shaft 62, as shown in FIG. 1, there is a locator pin 76 affixed substantially perpendicular to said shaft. There is also a block 78 located along shaft 62 and adjacent to endplate 56. Pin 76 and block 78 cooperate with shaft 62 to control alignment of cams 64 with appropriate wafers 10 to be displaced.

Block 78 has first, second and third slotted seats 80, 81 and 82, respectively, cut transversely of shaft 62 for receiving pin 76 in either of three fixed positions. FIG. 2 further shows in block 78 a longitudinally cut channel 85 which enables pin 76 to be translated when shaft 62 is indexed. Block 78 is advantageously made from a lubricative block of material or is coated with a lubricative coating to permit shaft 62 and pin 76 to be operated therein with little friction.

Operation

FIG. 1 shows a handle 86 affixed to shaft 62 extending in the same direction as pin 76, i.e., perpendicularly from shaft 62 toward the side of apparatus 40 containing sideplates 46. The eccentric portions of cams 64 hang downwardly in FIG. 1 and as shown in FIG. 3 in phantom outline. In the described condition all cams 64 are disengaged and the apparatus 40 could be said to be at rest. When handle 86 is rotated 180 degrees so that it and locator pin 76 extend toward the side containing sidewall 48 the apparatus 40 is fully operated. Then the eccentric portion of the cams 64 are extended upwardly as shown solidly in FIG. 3. In the operative condition locator pin 76 rests in a selected one of seats 80–82.

The apparatus 40 in the illustrative example operates on eight wafers 10 in each of three cycles. Consequently, twenty-four of the wafers 10 may be displaced over the full range of operation. If a carrier holds twenty-five wafers 10, either the lead or the trailing wafer 10 may be ignored when aligning cams 64 because each such wafer is easily accessible for application of a vacuum pickup tool from an end of carrier 20. Therefore, all wafers 10 are readily removed and reinserted in the pockets without significant risk thereto. On the other hand carrier 20 may be loaded with a desired multiple of wafers 10, such as for example twenty-four wafers, so all wafers are displaced upward by three cycles of operation (a displacement stage of one cycle is seen in FIGS. 2 and 3).

Miscellaneous Considerations

By reference to the location of flats 12 in FIG. 3, it is seen that each displaced wafer 10 may rotate as it is translated upwardly along the guides 26. Quite often such rotation is preferred so that one may examine more surface of each wafer 10 than could be seen without rotation thereof. Consequently, it may be desirable to provide a frictional, peripheral surface on cam 64 to frictionally engage edge portions of each wafer. Then the wafers 10 may be displaced with a maximum of rotation.

On the other hand, the flats 12 are sometimes oriented uniformly in a single file to facilitate transfer of wafers or to read wafer identification applied to a uniform location on each wafer. Accordingly, it may be desirable to provide a lubricative peripheral surface on a cam 64 to slideably engage edge portions of each wafer 10. Then the wafers 10 may be displaced with a minimum of rotation thereof.

It has been mentioned that the wafers 10 are optimally oriented substantially vertically along a horizontal file. Nevertheless, it will be appreciated that the carrier 20 could be set nearly on an end for displacement and all other features could be located to accommodate the carrier. Consequently, the wafers 10 would then be more nearly horizontal and the common axis of the file would be more nearly vertical. Furthermore, it is within the spirit and scope of the invention to apply a motorized drive to shaft 62 and to employ at least semi-automatic controls thereto, all of which would be known or inferred by one of ordinary skill in this art.

There have been illustrated herein certain embodiments of the invention and certain applications thereof. Nevertheless, it is to be understood that various modifications and refinements may be made and used which differ from these disclosed embodiments without departing from the spirit and scope of the present invention.

What is claimed is:

1. Apparatus for selecting at least one planate article from an array thereof, comprising:
    a carrier for holding such articles in a mutually spaced, substantially parallel relationship along a single file by supporting peripheral portions of each article in opposing guides formed along opposing first and second sides of said carrier;
    means for positioning the carrier so the file of articles extends substantially along a positioning plane passing generally centrally of each article and of said positioning means;
    a rotatable shaft extending parallel to and indexable along the file and adjacent to the articles;
    at least one cam mounted eccentrically to the shaft such that when said shaft is rotated a convex portion of said cam moves arcuately toward and slidably engages edge portions of an article to displace said article; and
    means for indexing the shaft and cam along the file and for rotating the same such that selected articles therein are engageable for displacement.

2. Apparatus as in claim 1, wherein the articles are disc-shaped wafers of semiconductor material and the cam is made of a resilient material which yields sufficiently upon contact to avoid damage to a wafer, further comprising:
    a wafer engaging surface extending about the periphery of the cam including a groove therein to engage peripheral edge portions of a wafer, said engaging surface and said groove being sufficiently wide to enage the wafer over openings formed by the guides holding the wafer.

3. Apparatus as in claim 2, wherein the engaging surface extends about the periphery of the cam in a circular arc at least over the portion which contacts a wafer to be displaced.

4. Apparatus as in claim 3, wherein the shaft is eccentric of the positioning plane and wherein the wafer is vertically oriented and so elevated that the cam engages substantially symmetrically about the center of gravity of the wafer.

5. Apparatus as in claim 4, wherein the meand for indexing the cam includes means for indexing the shaft along the file, further comrising:
    a plurality of cams mounted to the shaft, each being subjacent to and in a plane passing substantially through every third wafer in the file;
    a locator pin affixed substantially perpendicular to the shaft; and
    a block located along the shaft with first, second and third seats therein the receiving the locator pin.

6. Apparatus as in claim 5 further comprising:
    a handle affixed to the shaft to operate the wafer engaging means in stages as follows:
    (a) With the eccentric cam portions away from the wafers, to index the shaft to align the locator pin with a desired one of the three seats in the end block;

(b) To rotate the shaft in a first direction to arcuately move the locator pin into the desired seat, the eccentric portions of the cams being moved arcuately thereby to engage and displace every third wafer starting with a desired wafer in the file;

(c) To rotate the shaft in a second direction to move the locator pin out of the seat to arcuately move the eccentric portions of the cams away from the wafers and to index the shaft to align the locator pin with another seat;

(d) To repeat stages (a), (b) and (c) to successively displace one-third of the wafers at each seat position and, therefore, to displace all wafers as desired to select wafers from the file.

7. A method of selecting at least one planate article from an array thereof, comprising:

holding such articles in mutually spaced, substantially parallel relationship along a single file in a carrier by supporting peripheral portions of each article in opposing guides formed along opposing first and second sides of said carrier;

positioning the carrier upon means therefor so the file of articles extends substantially along a positioning plane passing generally centrally of each article and of said positioning means;

extending a rotatable shaft parallel to and indexable along the file and adjacent to the articles, said shaft including means mounted thereto for engaging the articles;

rotating at least one cam mounted eccentrically of the shaft, an arcuate portion of said cam moving arcuately toward and movingly engaging edge portions of an article and displacing said article; and indexing the shaft and cam along the file and rotating the same such that selected articles therein are engageable for displacement.

8. A method as in claim 7, wherein the articles are wafers of semiconductor material and wherein the engaging step further comprises:

rotating a cam formed of a resilient material, said material yielding sufficiently upon contact to avoid damage to a wafer; and engaging peripheral edge portions of a wafer to a groove in a surface extending about the periphery of the cam in a circular arc, said engaging surface being sufficiently wide so the wafer is engaged over openings formed by the guides holding the wafer.

9. A method as in claim 8, wherein extending the shaft includes:

extending the shaft eccentrically of the positioning plane; and wherein engaging includes:

engaging the cam to a vertically oriented wafer at such elevation that the cam engages substantially symmetrically about the center of gravity of the wafer.

10. A method as in claim 9, wherein indexing the cam includes extending the shaft along the file, further comprising:

mounting a plurality of cams to the shaft, each being subjacent to and in a plane passing substantially through every third wafer in the file;

affixing a locator pin substantially perpendicular to the shaft;

locating a block along the shaft, said block having first, second and third seats therein for receiving the locator pin; and affixing a handle to the shaft to operate the wafer engaging means in stages.

11. A method as in claim 10, wherein the eccentric cam portions are initially away from the wafers, further comprising:

(a) indexing the shaft to align the locator pin with a desired one of the three seats in the end block;

(b) rotating the shaft in a first direction to arcuately move the locator pin into the desired seat, the eccentric portions of the cams being moved arcuately thereby to engage and displace every third wafer starting with a desired wafer in the file;

(c) rotating the shaft in a second direction to move the locator pin out of the seat to arcuately move the eccentric portions of the cams away from the wafers and indexing the shaft to align the locator pin with another seat; and (d) repeating stages (a), (b) and (c) to successively displace one-third of the wafers at each seat position and, therefore, to displace all wafers as desired to select wafers from the file.

12. A method as in claim 8, wherein the cam has a lubricative peripheral surface and wherein the engaging step includes:

slideably engaging edge portions of a wafer such that said wafer is displaced with a minimum of rotation.

13. A method as in claim 8, wherein the cam has a frictional peripheral surface and wherein the engaging step includes:

frictionally engaging edge portions of a wafer such that said wafer is displaced with a maximum of rotation.

* * * * *

UNITED STATES PATENT AND TRADEMARK OFFICE
CERTIFICATE OF CORRECTION

PATENT NO. : 4,436,474

DATED : March 13, 1984

INVENTOR(S) : J. W. Brossman, Jr., C. A. Nemeth, A. K. Shapiro

It is certified that error appears in the above—identified patent and that said Letters Patent is hereby corrected as shown below:

Column 1, line 62, "wafters" should read --wafers--.
Column 4, line 25, "aidewall" should read --sidewall--.
Column 4, line 36, "twnety-five" should read --twenty-five--.
In the claims, Column 8, claim 5, line 54, "meand" should read --means--. Column 8, claim 5, line 63, "the", first occurrence, should read -- for --.

Signed and Sealed this

Seventeenth Day of July 1984

[SEAL]

Attest:

GERALD J. MOSSINGHOFF

Attesting Officer

Commissioner of Patents and Trademarks